United States Patent
Chen et al.

(10) Patent No.: US 9,328,769 B1
(45) Date of Patent: May 3, 2016

(54) SLIDE RAIL ASSEMBLY AND BRACKET DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 14/606,160

(22) Filed: Jan. 27, 2015

(51) Int. Cl.
*A47B 88/04* (2006.01)
*F16C 29/00* (2006.01)
*F16C 33/02* (2006.01)
*F16C 35/02* (2006.01)
*H05K 7/14* (2006.01)

(52) U.S. Cl.
CPC ............ *F16C 29/005* (2013.01); *A47B 88/044* (2013.01); *F16C 29/004* (2013.01); *F16C 33/02* (2013.01); *F16C 35/02* (2013.01); *H05K 7/1489* (2013.01)

(58) Field of Classification Search
CPC ... H05K 7/1421; H05K 7/1489; A47B 88/04; A47B 88/10; A47B 88/044; A47B 2088/0418
See application file for complete search history.

(56) References Cited

U.S. PATENT DOCUMENTS

| | | | |
|---|---|---|---|
| 6,974,037 B2 | 12/2005 | Haney | |
| 8,028,965 B2 | 10/2011 | Chen et al. | |
| 8,721,012 B2 | 5/2014 | Chen et al. | |
| 9,144,173 B2 * | 9/2015 | Chen | H05K 7/1489 |
| 2001/0040142 A1* | 11/2001 | Haney | A47B 88/044 |
| | | | 211/183 |
| 2003/0019824 A1* | 1/2003 | Gray | A47B 57/30 |
| | | | 211/26 |
| 2003/0205539 A1* | 11/2003 | Lauchner | H05K 7/1489 |
| | | | 211/26 |
| 2006/0152115 A1* | 7/2006 | Dubon | A47B 88/044 |
| | | | 312/334.8 |
| 2008/0303390 A1* | 12/2008 | Hsiung | H05K 7/1489 |
| | | | 312/223.1 |
| 2009/0283652 A1* | 11/2009 | Chen | A47B 88/044 |
| | | | 248/298.1 |
| 2012/0087606 A1* | 4/2012 | Chen | A47B 88/08 |
| | | | 384/42 |
| 2014/0217049 A1* | 8/2014 | Chen | H05K 7/1489 |
| | | | 211/195 |
| 2014/0265786 A1* | 9/2014 | Chen | H05K 7/1489 |
| | | | 312/334.1 |

* cited by examiner

*Primary Examiner* — Daniel Rohrhoff
(74) *Attorney, Agent, or Firm* — Rosenberg, Klein & Lee

(57) ABSTRACT

A slide rail assembly includes a rail mounted with a bracket device whereby the slide rail assembly can be mounted to a rack. The bracket device includes a first supporting bracket, a second supporting bracket, a third supporting bracket, a mounting bracket, and a connecting member. The first supporting bracket is connected to the rail. The second supporting bracket is movably connected to the first supporting bracket. The second supporting bracket, the third supporting bracket, and the mounting bracket are movably connected and support one another. The mounting bracket includes first and second blocking portions and a slot formed between the first and the second blocking portions. The connecting member passes through the slot and is connected to the third supporting bracket.

17 Claims, 8 Drawing Sheets

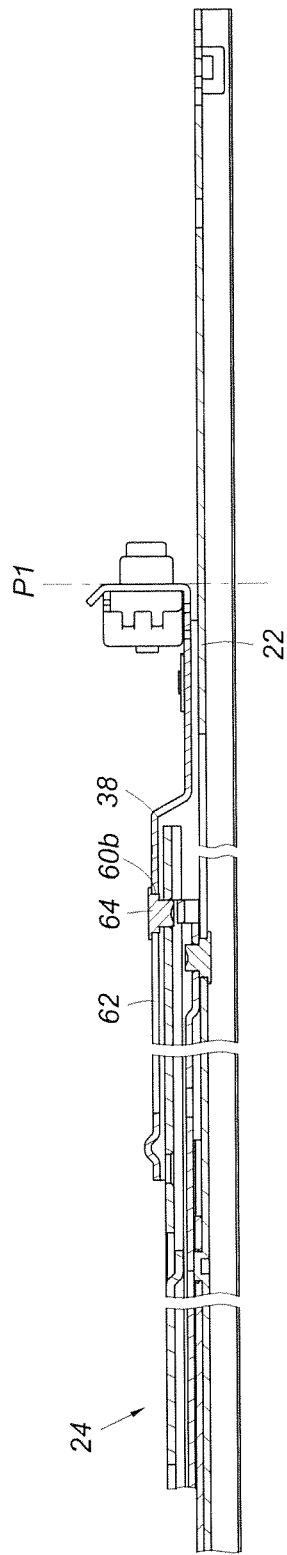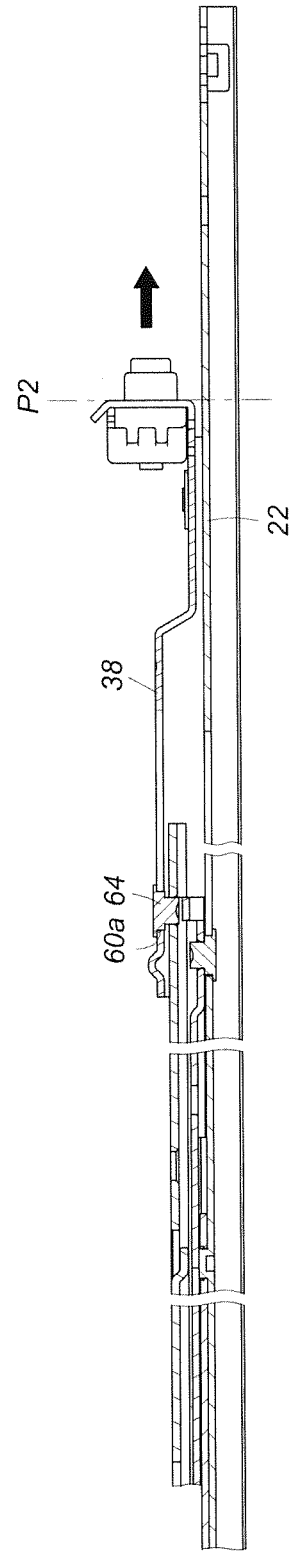

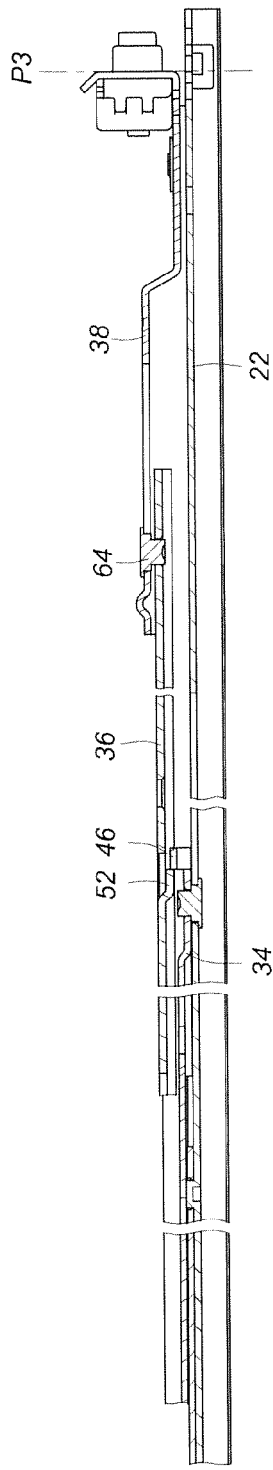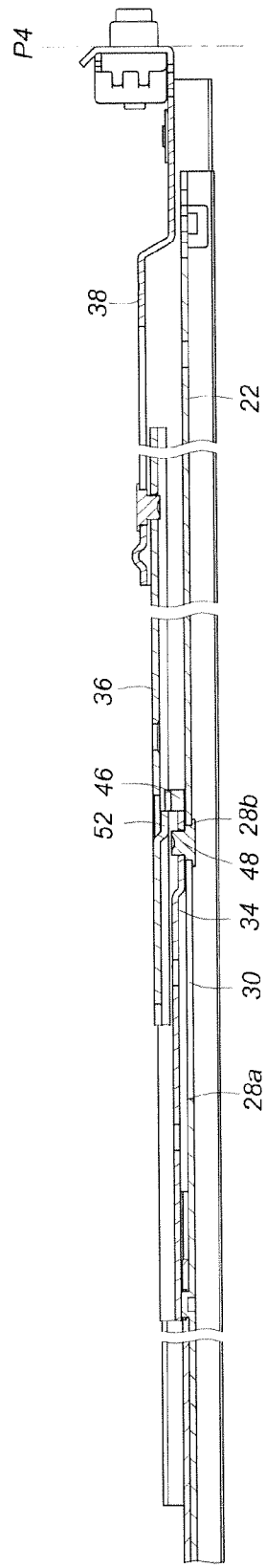
FIG. 6C
FIG. 6D

SLIDE RAIL ASSEMBLY AND BRACKET DEVICE THEREOF

FIELD OF THE INVENTION

The present invention relates to a slide rail and more particularly to a slide rail assembly with a bracket device adaptive to racks of different depths.

BACKGROUND OF THE INVENTION

Generally, a slide rail assembly in a rack-based server system is mounted with a bracket at the front as well as at the rear in order to be mounted to two posts of a rack via the two brackets. As the distance between the two posts may vary with system design or due to other factors, adjustable brackets are in demand. U.S. Pat. No. 8,028,965 B2 and U.S. Pat. No. 8,721,012 B2, for example, disclose such adjustable brackets. The disclosure of these two US patents is incorporated herein by reference.

SUMMARY OF THE INVENTION

The present invention relates to a bracket device applicable to a slide rail assembly and adaptive to racks of different depths.

According to one aspect of the present invention, a bracket device applicable to a rail of a slide rail assembly includes a first supporting bracket, a second supporting bracket, a third supporting bracket, and a mounting bracket. The first supporting bracket is connected to the rail of the slide rail assembly. The second supporting bracket is movably connected to the first supporting bracket. The third supporting bracket is movably connected to the second supporting bracket. The mounting bracket is movably connected to the third supporting bracket and includes a side plate, an end plate substantially perpendicularly connected to the side plate, and at least one mounting member connected to the end plate.

According to another aspect of the present invention, a slide rail assembly includes: a rail having two portions; and a bracket device and another bracket device respectively mounted to the two portions of the rail so that the slide rail assembly can be mounted to a first post and a second post of a rack. The bracket device includes a first supporting bracket, a second supporting bracket, a third supporting bracket, and a mounting bracket. The first supporting bracket is connected to the rail of the slide rail assembly. The second supporting bracket is movably connected to the first supporting bracket. The third supporting bracket is movably connected to the second supporting bracket. The mounting bracket is movably connected to the third supporting bracket and includes a side plate, an end plate substantially perpendicularly connected to the side plate, and at least one mounting member connected to the end plate.

According to yet another aspect of the present invention, a bracket device applicable to a rail of a slide rail assembly is provided, wherein the rail includes an upper wall, a lower wall, and a middle wall extending and connected between the upper wall of the rail and the lower wall of the rail. The bracket device includes a first supporting bracket, a second supporting bracket, a third supporting bracket, and a mounting bracket. The first supporting bracket is connected to the middle wall of the rail and includes an upper wall, a lower wall, a middle wall extending and connected between the upper wall of the first supporting bracket and the lower wall of the first supporting bracket, a first bent portion bent downward from the upper wall of the first supporting bracket, and a second bent portion bent upward from the lower wall of the first supporting bracket and corresponding to the first bent portion of the first supporting bracket. The upper wall, the lower wall, the middle wall, the first bent portion, and the second bent portion of the first supporting bracket jointly define a supporting passage. The second supporting bracket is located in the supporting passage of the first supporting bracket and includes an upper wall, a lower wall, a middle wall extending and connected between the upper wall of the second supporting bracket and the lower wall of the second supporting bracket, a first bent portion bent downward from the upper wall of the second supporting bracket, and a second bent portion bent upward from the lower wall of the second supporting bracket. The upper wall of the second supporting bracket is located in the supporting passage of the first supporting bracket and is adjacent to the upper wall of the first supporting bracket. The lower wall of the second supporting bracket is located in the supporting passage of the first supporting bracket and is adjacent to the lower wall of the first supporting bracket. The middle wall of the second supporting bracket is located in the supporting passage of the first supporting bracket and is adjacent to the middle wall of the first supporting bracket. The upper wall, the lower wall, the middle wall, the first bent portion, and the second bent portion of the second supporting bracket jointly define a supporting passage. The third supporting bracket is located in the supporting passage of the second supporting bracket and includes a first bent portion, a second bent portion, and a middle wall extending and connected between the first bent portion of the third supporting bracket and the second bent portion of the third supporting bracket. The first bent portion of the third supporting bracket is located in the supporting passage of the second supporting bracket and is adjacent to the upper wall of the second supporting bracket. The second bent portion of the third supporting bracket is located in the supporting passage of the second supporting bracket and is adjacent to the lower wall of the second supporting bracket. The mounting bracket includes a side plate adjacent to the middle wall of the third supporting bracket, an upper wall and a lower wall respectively connected to two opposite sides of the side plate, a first bent portion bent downward from the upper wall of the mounting bracket, and a second bent portion bent upward from the lower wall of the mounting bracket. The side plate, the upper wall, and the lower wall of the mounting bracket jointly define a receiving space for receiving the first supporting bracket, the second supporting bracket, and the third supporting bracket. A bracket passage in which the rail can be inserted is defined between the first bent portion of the mounting bracket and the second bent portion of the mounting bracket. The first bent portion of the mounting bracket corresponds to the upper wall of the rail while the second bent portion of the mounting bracket corresponds to the lower wall of the rail.

In some embodiments of any of the above aspects, the rail of the slide rail assembly further includes a side, and the first supporting bracket is connected to the side of the rail of the slide rail assembly.

In some embodiments of any of the above aspects, the rail further includes a first blocking portion and a second blocking portion, a slot is defined between the first blocking portion of the rail and the second blocking portion of the rail, and the bracket device further includes a protruding member passing through the slot of the rail and connected to the second supporting bracket.

In some embodiments of any of the above aspects, the second supporting bracket includes a blocking section, and the third supporting bracket includes a blocking section corresponding to the blocking section of the second supporting bracket.

In some embodiments of any of the above aspects, the mounting bracket further includes a first bent portion and a second bent portion respectively connected to two opposite sides of the side plate, there is a bracket passage between the first bent portion and the second bent portion, and the rail of the slide rail assembly is inserted in the bracket passage such that the mounting bracket is mounted to the rail and can be displaced relative to the rail.

In some embodiments of any of the above aspects, the side plate of the mounting bracket further includes a first blocking portion and a second blocking portion, a slot is defined between the first blocking portion of the mounting bracket and the second blocking portion of the mounting bracket, and the bracket device further includes a connecting member passing through the slot of the side plate of the mounting bracket and connected to the third supporting bracket.

One of the advantageous features of implementing the present invention is that the bracket device of the slide rail assembly can adapt to racks of various depths.

BRIEF DESCRIPTION OF THE DRAWINGS

The invention as well as a preferred mode of use and the advantages thereof will be best understood by referring to the following detailed description of some illustrative embodiments in conjunction with the accompanying drawings, in which:

FIG. 6A is a schematic drawing in which the mounting bracket in an embodiment of the present invention is at a first position relative to the rail of the slide rail assembly;

FIG. 6B is a schematic drawing in which the mounting bracket in FIG. 6A has been adjusted (i.e., displaced) to a second position relative to the rail of the slide rail assembly;

FIG. 6C is a schematic drawing in which the mounting bracket in FIG. 6A has been adjusted (i.e., displaced) to a third position relative to the rail of the slide rail assembly;

FIG. 6D is a schematic drawing in which the mounting bracket in FIG. 6A has been adjusted (i.e., displaced) to a fourth position relative to the rail of the slide rail assembly.

DETAILED DESCRIPTION OF THE INVENTION

Figure 1:
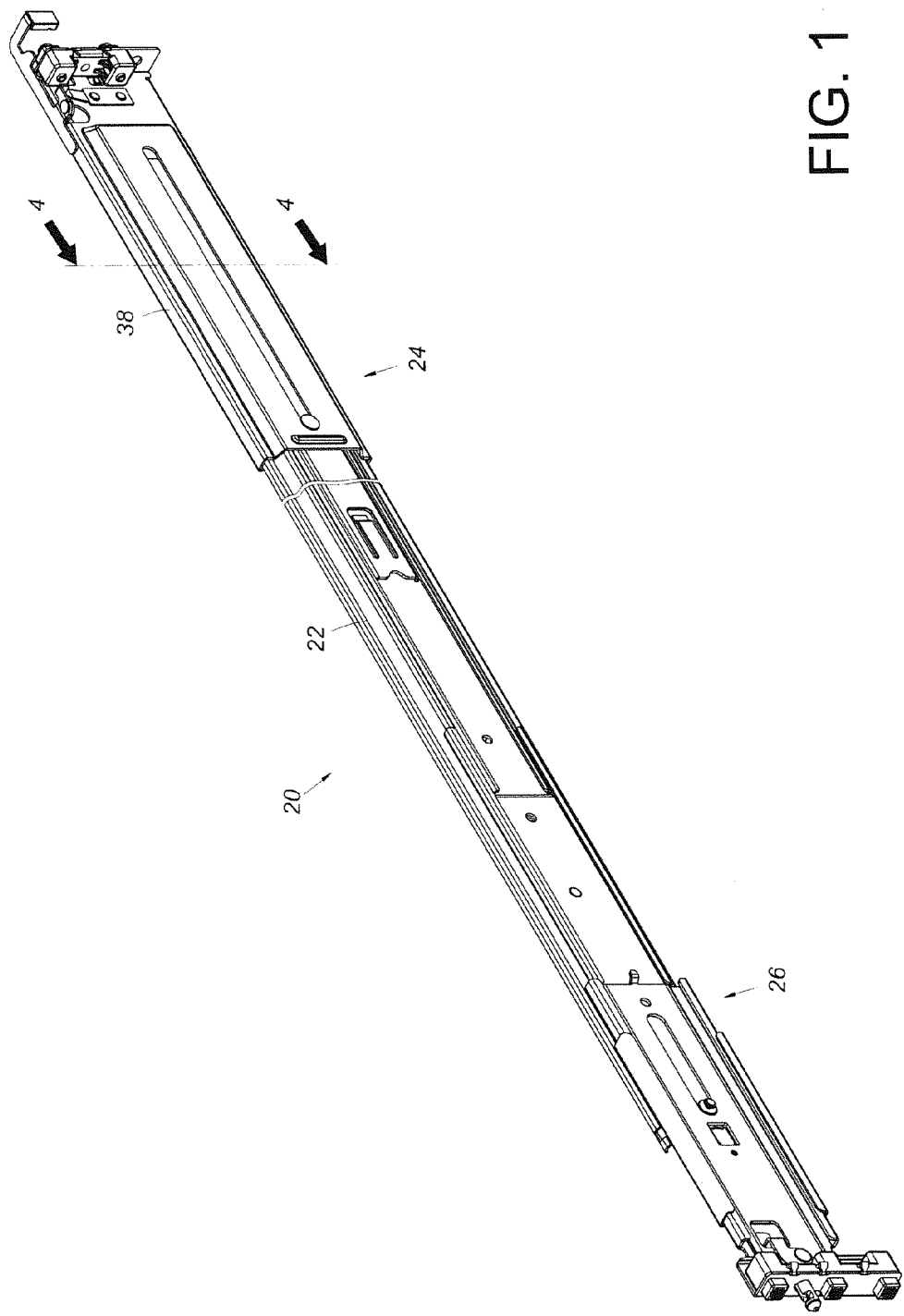
FIG. 1 is a schematic perspective view of the slide rail assembly in an embodiment of the present invention, wherein the slide rail assembly includes bracket devices.

Referring to FIG. 1, the slide rail assembly 20 in an embodiment of the present invention includes a rail 22. The rail 22 has two portions (e.g., a front portion and a rear portion) which are mounted with a bracket device 24 and a bracket device 26 respectively. Hereinafter, the bracket device 24 is detailed to illustrate the features of the preferred embodiments of the present invention.

Figure 2:
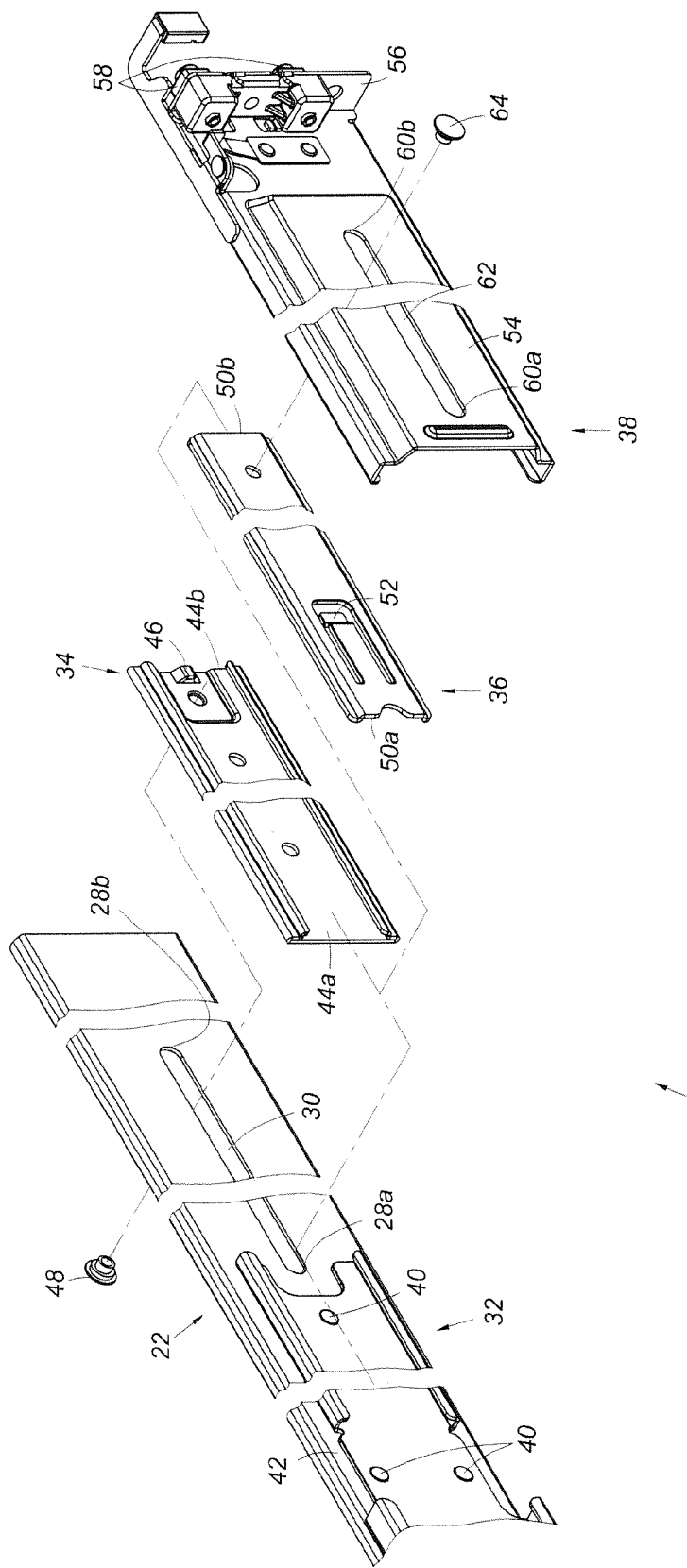
FIG. 2 is a schematic exploded view of the bracket device in an embodiment of the present invention.
Figure 3:
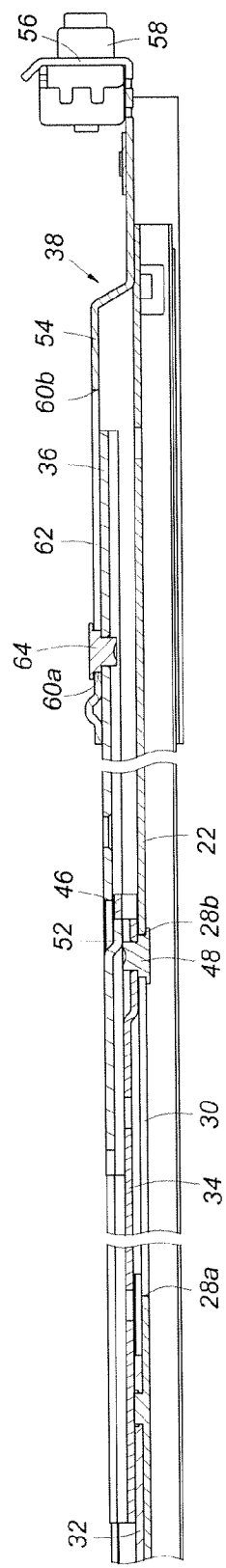
FIG. 3 is a schematic assembled sectional view of the bracket device in an embodiment of the present invention.

In a preferred embodiment as shown in FIG. 2 and FIG. 3, the rail 22 includes a first blocking portion 28a and a second blocking portion 28b, and a slot 30 is defined between the first blocking portion 28a and the second blocking portion 28b. The bracket device 24 includes a first supporting bracket 32, a second supporting bracket 34, a third supporting bracket 36, and a mounting bracket 38.

The first supporting bracket 32 is fixedly connected to the rail 22. For instance, the first supporting bracket 32 is fixedly connected to a side 42 (e.g., the rear side) of the rail 22 by a plurality of positioning elements 40 and is adjacent to the first blocking portion 28a of the rail 22. As the first supporting bracket 32 is fixedly connected to the rail 22, the first supporting bracket 32 can be viewed as a part of the rail 22. It is also feasible to connect the first supporting bracket 32 to the rail 22 by other connecting means such as soldering, threaded connection, or mechanical engagement. The present invention imposes no limitations in this respect.

The second supporting bracket 34 is movably connected to the first supporting bracket 32. The second supporting bracket 34 includes a first portion 44a, a second portion 44b opposite the first portion 44a, and a blocking section 46 located between the first portion 44a and the second portion 44b. The first portion 44a is movably connected to the first supporting bracket 32. The second portion 44b corresponds to the slot 30 of the rail 22 and includes a protruding member 48. The protruding member 48 can be formed with the second portion 44b or, as in this embodiment, be a separate component. A portion of the protruding member 48 passes through the slot 30 of the rail 22 and is connected to the second portion 44b such that the remaining portion of the protruding member 48 is limited between the first blocking portion 28a and the second blocking portion 28b of the rail 22. This allows the second supporting bracket 34 to be adjusted (i.e., displaced) relative to the first supporting bracket 32 to a limited extent defined by the length of the slot 30. Preferably, the blocking section 46 is adjacent to the second portion 44b.

The third supporting bracket 36 is movably connected to the second supporting bracket 34. The third supporting bracket 36 includes a first portion 50a, a second portion 50b opposite the first portion 50a, and a blocking section 52 located between the first portion 50a and the second portion 50b. The blocking section 52 of the third supporting bracket 36 corresponds in position to the blocking section 46 of the second supporting bracket 34.

The mounting bracket 38 is movably connected to the third supporting bracket 36. The mounting bracket 38 includes a side plate 54, an end plate 56 substantially perpendicularly connected to the side plate 54, and at least one mounting member 58 connected to the end plate 56. In this embodiment, two mounting members 58 are provided by way of example. In a preferred embodiment, the side plate 54 further includes a first blocking portion 60a and a second blocking portion 60b, and a slot 62 is defined between the first blocking portion 60a and the second blocking portion 60b.

It is worth mentioning that the third supporting bracket 36 includes a connecting member 64. The connecting member 64 can be formed with the third supporting member 36 or, as in this embodiment, be a separate component. A portion of the connecting member 64 passes through the slot 62 of the side plate 54 and is connected to the third supporting bracket 36 such that the remaining portion of the connecting member 64 is limited between the first blocking portion 60a and the second blocking portion 60b of the side plate 54. This allows the mounting bracket 38 to be adjusted (i.e., displaced) relative to the third supporting bracket 36 to a limited extent defined by the length of the slot 62.

Figure 4:
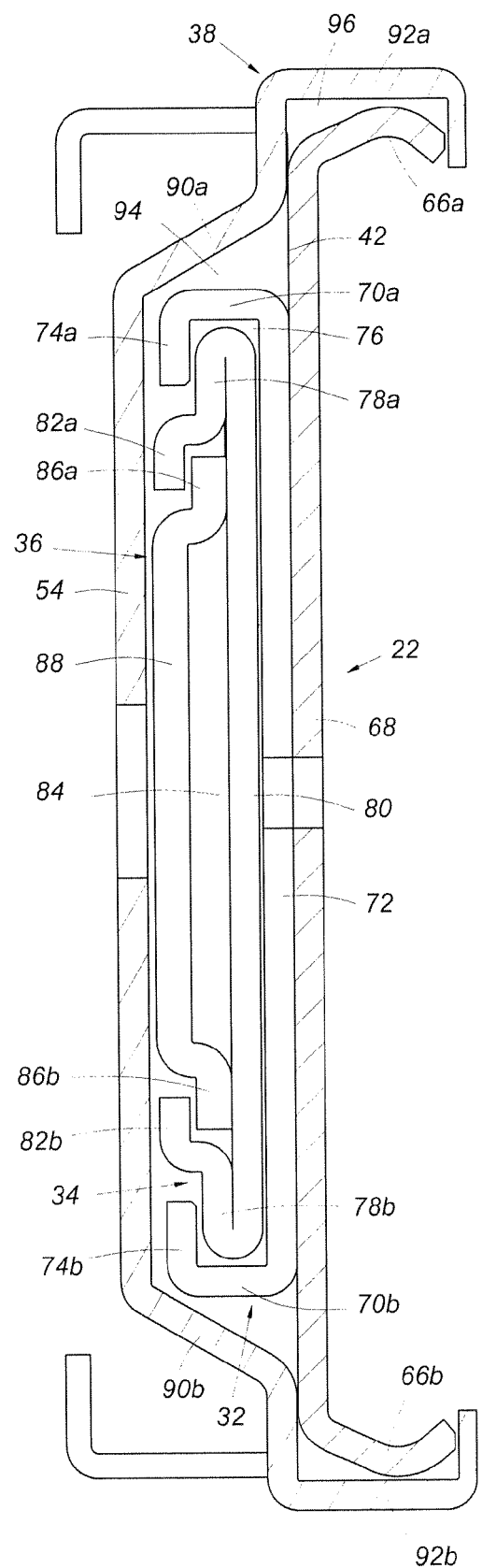
FIG. 4 is a schematic sectional view taken along line 4-4 in FIG. 1.

Referring to FIG. 4, the rail 22 further includes an upper wall 66a, a lower wall 66b, and a middle wall 68 extending and connected between the upper wall 66a and the lower wall 66b.

The first supporting bracket 32 includes an upper wall 70a, a lower wall 70b, a middle wall 72 extending and connected between the upper wall 70a and the lower wall 70b, a first bent portion 74a bent downward from the upper wall 70a, and a second bent portion 74b bent upward from the lower wall 70b and corresponding to the first bent portion 74a. The upper wall 70a, the lower wall 70b, the middle wall 72, the first bent portion 74a, and the second bent portion 74b jointly define a supporting passage 76. The first supporting bracket 32 is fixedly connected to the side 42 of the middle wall 68 of the rail 22 through the middle wall 72.

The second supporting bracket 34 is located in the supporting passage 76 of the first supporting bracket 32. The second supporting bracket 34 includes an upper wall 78a, a lower wall 78b, a middle wall 80 extending and connected between the upper wall 78a and the lower wall 78b, a first bent portion 82a bent downward from the upper wall 78a, and a second bent portion 82b bent upward from the lower wall 78b and corresponding to the first bent portion 82a. The upper wall 78a, the lower wall 78b, the middle wall 80, the first bent portion 82a, and the second bent portion 82b jointly define a supporting passage 84. The upper wall 78a is further bent backward and pressed against the middle wall 80 at a position adjacent to an upper part of the middle wall 80, is located in the supporting passage 76 of the first supporting bracket 32 and adjacent to the upper wall 70a, and thus forms an upper support. The lower wall 78b is further bent backward and pressed against the middle wall 80 at a position adjacent to a lower part of the middle wall 80, is located in the supporting passage 76 of the first supporting bracket 32 and adjacent to the lower wall 70b, and thus forms a lower support. The middle wall 80 is located in the supporting passage 76 of the first supporting bracket 32 and adjacent to the middle wall 72 and thus forms a middle support.

The third supporting bracket 36 is located in the supporting passage 84 of the second supporting bracket 34. The third supporting bracket 36 includes a first bent portion 86a, a second bent portion 86b, and a middle wall 88 extending and connected between the first bent portion 86a and the second bent portion 86b. The first bent portion 86a is bent from the middle wall 88 and turned upward, is located in the supporting passage 84 of the second supporting bracket 34 and adjacent to the upper wall 78a, and thus forms an upper support. The second bent portion 86b is bent from the middle wall 88 and turned downward, is located in the supporting passage 84 of the second supporting bracket 34 and adjacent to the lower wall 78b, and thus forms a lower support. The middle wall 88 is adjacent to the side plate 54 of the mounting bracket 38 (in other words, the side plate 54 of the mounting bracket 38 is adjacent to the middle wall 88 of the third supporting bracket 36) and forms a middle support.

The mounting bracket 38 includes an upper wall 90a and a lower wall 90b respectively connected to two opposite sides of the side plate 54, a first bent portion 92a bent downward from the upper wall 90a, and a second bent portion 92b bent upward from the lower wall 90b and corresponding to the first bent portion 92a. The side plate 54, the upper wall 90a, and the lower wall 90b jointly define a receiving space 94 for receiving the first supporting bracket 32, the second supporting bracket 34, and the third supporting bracket 36. Defined between the first bent portion 92a and the second bent portion 92b is a bracket passage 96 in which the rail 22 can be inserted. More particularly, the first bent portion 92a is configured to hold the upper wall 66a of the rail 22 and hence forms an upper support, and the second bent portion 92b is configured to hold the lower wall 66b of the rail 22 and hence forms a lower support. Thus, displacement of the mounting bracket 38 relative to the rail 22 can be carried out in a well-supported manner, and the first supporting bracket 32, the second supporting bracket 34, and/or the third supporting bracket 36 can be adjusted (i.e., displaced) relative to one another also in a well-supported manner.

Figure 5:
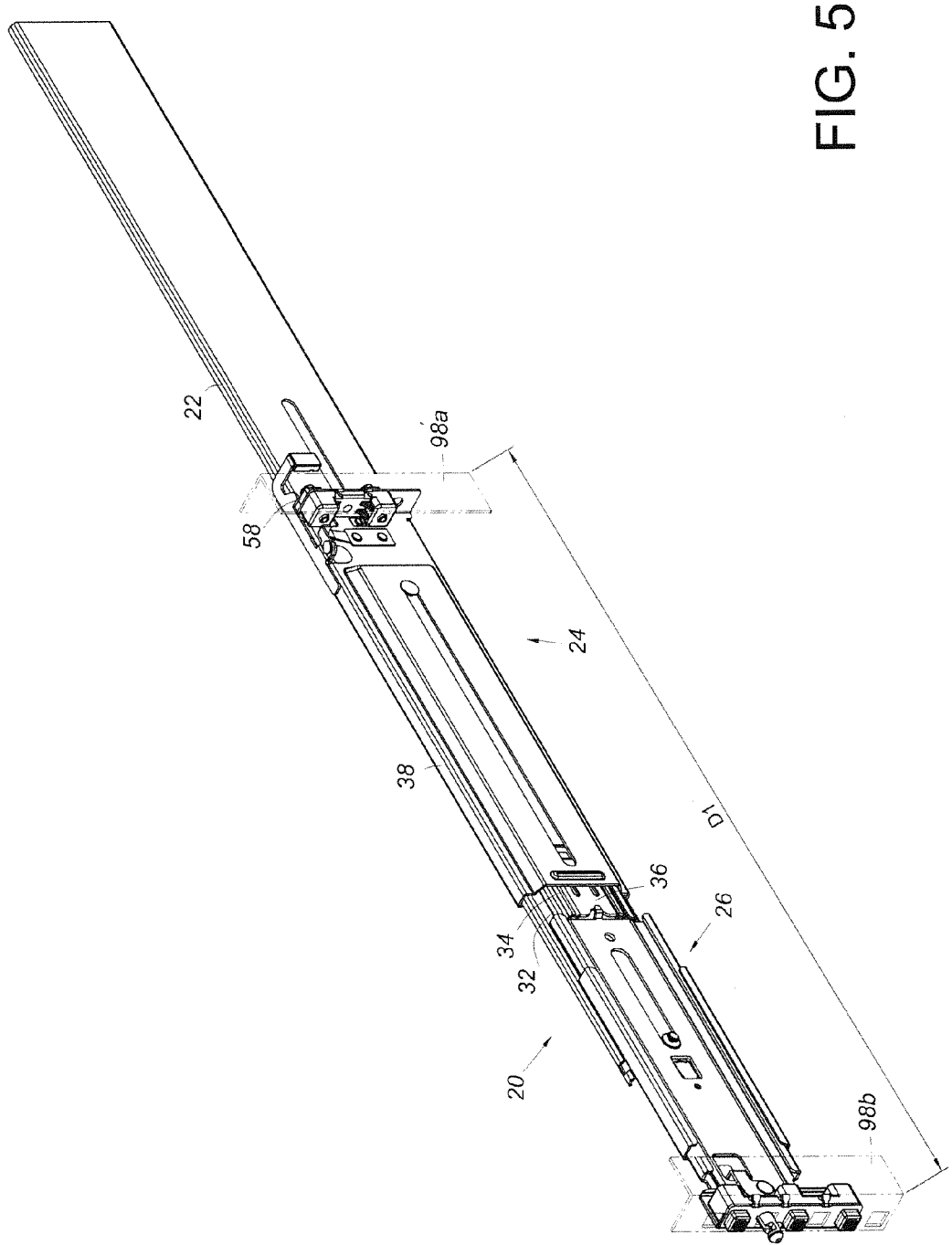
FIG. 5 schematically shows how the slide rail assembly in an embodiment of the present invention is mounted to a rack via the bracket devices.

FIG. 5 shows how the slide rail assembly 20 is mounted to a first post 98a and a second post 98b of a rack via the bracket device 24 and the bracket device 26. More specifically, the bracket device 26 can be mounted to the second post 98b when a first distance D1 exists between the first post 98a and the second post 98b, and the mounting bracket 38 of the bracket device 24 can be adjusted to adapt the distance between the mounting bracket 38 of the bracket device 24 and the bracket device 26 to the first distance D1. The mounting bracket 38 is mounted to the first post 98a via the mounting members 58.

In FIG. 6A, the mounting bracket 38 of the bracket device 24 is at a first position P1 relative to the rail 22, with the connecting member 64 located in the slot 62 of the mounting bracket 38 and adjacent to the second blocking portion 60b.

FIG. 6B shows that the mounting bracket 38 can be adjusted in the arrow-indicated direction from the first position P1 to a second position P2 relative to the rail 22 such that the first blocking portion 60a of the mounting bracket 38 is pressed against the connecting member 64.

Referring to FIG. 6C, the mounting bracket 38 can be further adjusted according to the user's need and displaced from the second position P2 to a third position P3 relative to the rail 22 such that, with the connecting member 64 driving the third supporting bracket 36 into displacement, the blocking section 52 of the third supporting bracket 36 is pressed against the blocking section 46 of the second supporting bracket 34.

In FIG. 6D, the mounting bracket 38 has been further adjusted according to the user's need and displaced from the third position P3 to a fourth position P4 relative to the rail 22. During the adjustment, the blocking section 52 of the third supporting bracket 36 is pressed against the blocking section 46 of the second supporting bracket 34 and drives the second supporting bracket 34 into displacement. As a result, the protruding member 48 is driven by the second supporting bracket 34 to displace in the slot 30 of the rail 22 from the first blocking portion 28a to a position adjacent to the second blocking portion 28b.

Figure 7:
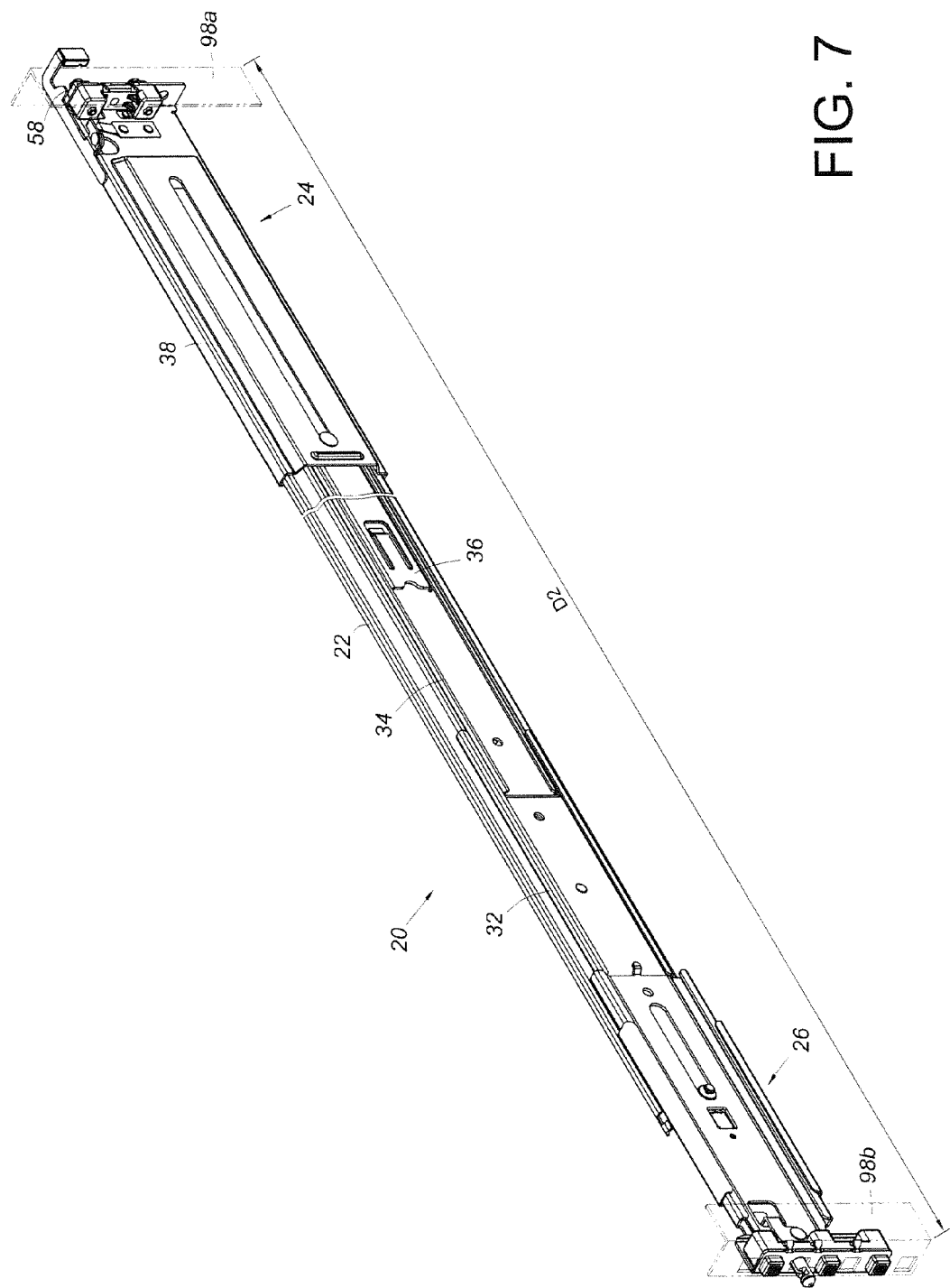
FIG. 7 schematically shows how the slide rail assembly in FIG. 5 is mounted to another rack via the bracket devices.

FIG. 7 shows that the bracket device 26 can be mounted to the second post 98b when a second distance D2 exists between the first post 98a and the second post 98b. As shown in the drawing, the mounting bracket 38 of the bracket device 24 has been adjusted to a position where the distance between the mounting bracket 38 of the bracket device 24 and the bracket device 26 is adapted to the second distance D2. It can be known from the above that the present embodiment can adapt to racks of different depths, thanks to the adjustability of the bracket device 24. In particular, the first supporting bracket 32, the second supporting bracket 34, the third supporting bracket 36, the rail 22, and the mounting bracket 38 continue to support one another when the bracket device 24 is adjusted to an extended state, thereby ensuring support for and hence stability of the extended bracket device 24.

While the present invention has been disclosed by the preferred embodiments described above, the embodiments are not intended to be restrictive of the present invention. The scope of patent protection sought by the applicant is defined by the appended claims.

The invention claimed is:

1. A bracket device applicable to a rail of a slide rail assembly, the bracket device comprising:
   a first supporting bracket connected to the rail of the slide rail assembly;
   a second supporting bracket movably connected to the first supporting bracket;
   a third supporting bracket movably connected to the second supporting bracket;
   a mounting bracket movably connected to the third supporting bracket, wherein the mounting bracket comprises a side plate, an end plate substantially perpendicularly connected to the side plate, and at least one mounting member connected to the end plate; the side plate comprises a first blocking portion and a second blocking portion; and a slot is defined between the first blocking portion of the side plate of the mounting bracket and the second blocking portion of the side plate of the mounting bracket; and
   a connecting member passing through the slot of the side plate of the mounting bracket and connected to the third supporting bracket;
   wherein the rail further comprises a first blocking portion and a second blocking portion, a slot is defined between the first blocking portion of the rail and the second blocking portion of the rail, and the bracket device further comprises a protruding member passing through the slot of the rail and connected to the second supporting bracket.

2. The bracket device of claim 1, wherein the rail of the slide rail assembly further comprises a side, and the first supporting bracket is connected to the side of the rail of the slide rail assembly.

3. The bracket device of claim 1, wherein the mounting bracket further comprises a first bent portion and a second bent portion respectively connected to two opposite sides of the side plate, a bracket passage is defined between the first bent portion and the second bent portion, and the rail of the slide rail assembly is inserted in the bracket passage such that the mounting bracket is mounted to the rail and displaceable relative to the rail.

4. A slide rail assembly, comprising: a rail having two portions; and a bracket device and another bracket device respectively mounted to the two portions of the rail so that the slide rail assembly is mountable to a first post and a second post of a rack, wherein the bracket device comprises:
   a first supporting bracket connected to the rail of the slide rail assembly;
   a second supporting bracket movably connected to the first supporting bracket;
   a third supporting bracket movably connected to the second supporting bracket;
   a mounting bracket movably connected to the third supporting bracket, the mounting bracket comprising a side plate, an end plate substantially perpendicularly connected to the side plate, and at least one mounting member connected to the end plate, wherein the side plate comprises a first blocking portion and a second blocking portion, and a slot is defined between the first blocking portion of the side plate and the second blocking portion of the side plate; and
   a connecting member passing through the slot of the side plate of the mounting bracket and connected to the third supporting bracket;
   wherein the rail further comprises a first blocking portion and a second blocking portion, a slot is defined between the first blocking portion of the rail and the second blocking portion of the rail, and the bracket device further comprises a protruding member passing through the slot of the rail and connected to the second supporting bracket.

5. The slide rail assembly of claim 4, wherein the rail further comprises a side, and the first supporting bracket is connected to the side of the rail.

6. The slide rail assembly of claim 4, wherein the mounting bracket further comprises a first bent portion and a second bent portion respectively connected to two opposite sides of the side plate, a bracket passage is defined between the first bent portion and the second bent portion, and the rail of the slide rail assembly is inserted in the bracket passage such that the mounting bracket is mounted to the rail and displaceable relative to the rail.

7. A bracket device applicable to a rail of a slide rail assembly, the rail comprising an upper wall, a lower wall, and a middle wall extending and connected between the upper wall of the rail and the lower wall of the rail, the bracket device comprising:
   a first supporting bracket connected to the middle wall of the rail, the first supporting bracket comprising an upper wall, a lower wall, a middle wall extending and connected between the upper wall of the first supporting bracket and the lower wall of the first supporting bracket, a first bent portion bent downward from the upper wall of the first supporting bracket, and a second bent portion bent upward from the lower wall of the first supporting bracket and corresponding to the first bent portion of the first supporting bracket, wherein the upper wall, the lower wall, the middle wall, the first bent portion, and the second bent portion of the first supporting bracket jointly define a supporting passage;
   a second supporting bracket located in the supporting passage of the first supporting bracket, the second supporting bracket comprising an upper wall, a lower wall, a middle wall extending and connected between the upper wall of the second supporting bracket and the lower wall of the second supporting bracket, a first bent portion bent downward from the upper wall of the second supporting bracket, and a second bent portion bent upward from the lower wall of the second supporting bracket, wherein the upper wall of the second supporting bracket is located in the supporting passage of the first supporting bracket and adjacent to the upper wall of the first supporting bracket, the lower wall of the second supporting bracket is located in the supporting passage of the first supporting bracket and adjacent to the lower wall of the first supporting bracket, the middle wall of the second supporting bracket is located in the supporting passage of the first supporting bracket and adjacent to the middle wall of the first supporting bracket, and the upper wall, the lower wall, the middle wall, the first bent portion, and the second bent portion of the second supporting bracket jointly define a supporting passage;
   a third supporting bracket located in the supporting passage of the second supporting bracket, the third supporting bracket comprising a first bent portion, a second bent portion, and a middle wall extending and connected between the first bent portion of the third supporting bracket and the second bent portion of the third supporting bracket, wherein the first bent portion of the third supporting bracket is located in the supporting passage of the second supporting bracket and adjacent to the upper wall of the second supporting bracket, and the second bent portion of the third supporting bracket is located in the supporting passage of the second supporting bracket and adjacent to the lower wall of the second supporting bracket; and a mounting bracket comprising a side plate adjacent to the middle wall of the third supporting bracket, an upper wall and a lower wall respectively connected to two opposite sides of the side plate, a first bent portion bent downward from the upper wall of the mounting bracket, and a second bent portion bent upward from the lower wall of the mounting bracket, wherein the side plate, the upper wall, and the lower wall of the mounting bracket jointly define a receiving space for receiving the first supporting bracket, the second supporting bracket, and the third supporting bracket; a bracket passage in which the rail is insertable is defined between the first bent portion of the mounting bracket and the second bent portion of the mounting bracket; the first bent portion of the mounting bracket corresponds to the upper wall of the rail; and the second bent portion of the mounting bracket corresponds to the lower wall of the rail.

8. The bracket device of claim 7, wherein the middle wall of the rail of the slide rail assembly further comprises a side, and the first supporting bracket is connected to the side of the middle wall of the rail.

9. The bracket device of claim 7, wherein the rail further comprises a first blocking portion and a second blocking portion, a slot is defined between the first blocking portion of the rail and the second blocking portion of the rail, and the bracket device further comprises a protruding member passing through the slot of the rail and connected to the second supporting bracket.

10. The bracket device of claim 7, wherein the second supporting bracket comprises a blocking section, and the third supporting bracket comprises a blocking section corresponding to the blocking section of the second supporting bracket.

11. The bracket device of claim 7, wherein the side plate of the mounting bracket further comprises a first blocking portion and a second blocking portion, a slot is defined between the first blocking portion of the mounting bracket and the second blocking portion of the mounting bracket, and the bracket device further comprises a connecting member passing through the slot of the side plate of the mounting bracket and connected to the third supporting bracket.

12. A bracket device applicable to a rail of a slide rail assembly, the bracket device comprising:
a first supporting bracket connected to the rail of the slide rail assembly;
a second supporting bracket movably connected to the first supporting bracket;
a third supporting bracket movably connected to the second supporting bracket;
a mounting bracket movably connected to the third supporting bracket, wherein the mounting bracket comprises a side plate, an end plate substantially perpendicularly connected to the side plate, and at least one mounting member connected to the end plate; the side plate comprises a first blocking portion and a second blocking portion; and a slot is defined between the first blocking portion of the side plate of the mounting bracket and the second blocking portion of the side plate of the mounting bracket; and
a connecting member passing through the slot of the side plate of the mounting bracket and connected to the third supporting bracket;
wherein the second supporting bracket comprises a blocking section, and the third supporting bracket comprises a blocking section corresponding to the blocking section of the second supporting bracket.

13. The bracket device of claim 12, wherein the rail of the slide rail assembly further comprises a side, and the first supporting bracket is connected to the side of the rail of the slide rail assembly.

14. The bracket device of claim 12, wherein the mounting bracket further comprises a first bent portion and a second bent portion respectively connected to two opposite sides of the side plate, a bracket passage is defined between the first bent portion and the second bent portion, and the rail of the slide rail assembly is inserted in the bracket passage such that the mounting bracket is mounted to the rail and displaceable relative to the rail.

15. A slide rail assembly, comprising: a rail having two portions; and a bracket device and another bracket device respectively mounted to the two portions of the rail so that the slide rail assembly is mountable to a first post and a second post of a rack, wherein the bracket device comprises:
a first supporting bracket connected to the rail of the slide rail assembly;
a second supporting bracket movably connected to the first supporting bracket;
a third supporting bracket movably connected to the second supporting bracket;
a mounting bracket movably connected to the third supporting bracket, the mounting bracket comprising a side plate, an end plate substantially perpendicularly connected to the side plate, and at least one mounting member connected to the end plate, wherein the side plate comprises a first blocking portion and a second blocking portion, and a slot is defined between the first blocking portion of the side plate and the second blocking portion of the side plate; and
a connecting member passing through the slot of the side plate of the mounting bracket and connected to the third supporting bracket;
wherein the second supporting bracket comprises a blocking section, and the third supporting bracket comprises a blocking section corresponding to the blocking section of the second supporting bracket.

16. The slide rail assembly of claim 15, wherein the rail further comprises a side, and the first supporting bracket is connected to the side of the rail.

17. The slide rail assembly of claim 15, wherein the mounting bracket further comprises a first bent portion and a second bent portion respectively connected to two opposite sides of the side plate, a bracket passage is defined between the first bent portion and the second bent portion, and the rail of the slide rail assembly is inserted in the bracket passage such that the mounting bracket is mounted to the rail and displaceable relative to the rail.

\* \* \* \* \*